United States Patent

Lee et al.

(10) Patent No.: US 9,196,452 B2
(45) Date of Patent: Nov. 24, 2015

(54) METHODS AND APPARATUS FOR CARBON ION SOURCE HEAD

(71) Applicant: Taiwan Semiconductor Manufacturing Company, Ltd., Hsin-Chu (TW)

(72) Inventors: Yi-Jiun Lee, Hsin-Chu (TW); Cheng-Hung Hu, Hsin-Chu (TW); Yh-Hsiu Hsiao, Zhunan Township (TW); Kan Hwa Chang, Hsin-Chu (TW); Ming-Te Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 328 days.

(21) Appl. No.: 13/790,783

(22) Filed: Mar. 8, 2013

(65) Prior Publication Data

US 2014/0256122 A1  Sep. 11, 2014

(51) Int. Cl.
*H01J 37/08* (2006.01)
*H01L 21/265* (2006.01)
*H01J 37/317* (2006.01)

(52) U.S. Cl.
CPC ........... *H01J 37/08* (2013.01); *H01L 21/26506* (2013.01); *H01J 37/3171* (2013.01)

(58) Field of Classification Search
CPC . H01J 37/08; H01J 37/3171; H01L 21/26506
See application file for complete search history.

(56) References Cited

U.S. PATENT DOCUMENTS

| | | |
|---|---|---|
| 4,218,633 A | 8/1980 | Mirtich, Jr. et al. |
| 2006/0097645 A1* | 5/2006 | Horsky ............ 315/111.81 |
| 2009/0200460 A1* | 8/2009 | Chaney et al. ........... 250/282 |
| 2012/0013249 A1 | 1/2012 | Jerez |
| 2012/0190181 A1 | 7/2012 | Lee et al. |

OTHER PUBLICATIONS

Sari, A.H., et al., "Formation of SIC using low energy $CO_2$ ion implantation in silicon," Plasma Physics Research Center, Science and Research Campus, Islamic Azad University, Tehran, Iran, Applied Surface Science 255, 2008, pp. 2180-2184.

* cited by examiner

*Primary Examiner* — Mary Ellen Bowman
(74) *Attorney, Agent, or Firm* — Slater & Matsil, L.L.P.

(57) ABSTRACT

Methods and apparatus for a carbon ion source head. An ionization chamber is configured to receive a process gas containing carbon and a noble carrier gas; a cathode is disposed in the ionization chamber and configured to emit electrons in thermionic emission; a graphite coating is provided on at least a portion of the cathode; and an outlet on the ionization chamber is configured to output carbon ions. A method for ion implantation of carbon is disclosed. Additional alternative embodiments are disclosed.

20 Claims, 3 Drawing Sheets

US 9,196,452 B2

METHODS AND APPARATUS FOR CARBON ION SOURCE HEAD

TECHNICAL FIELD

The present invention relates generally to ion implantation for semiconductor processes, and in particular, to producing carbon ions for ion implantation from an ion source head.

BACKGROUND

Ion implantation is used in semiconductor manufacturing to create doped layers or to modify a material. Carbon ions are increasingly used for implantation. Implanting carbon ions into a layer of crystallized semiconductor material, such as silicon, can provide a pre-amorphization layer. Carbon ion implantation is also used to provide a barrier, preventing dopant atoms such as boron and phosphorous from out-diffusion.

In conventional approaches to carbon ion implantation, a carbon containing gas such as carbon monoxide (CO) or carbon dioxide ($CO_2$) gas is combined with a carrier gas such as phosphine ($PH_3$). These gases are introduced into an ionization chamber, which is referred to as an arc or plasma chamber. While the gasses are introduced into the chamber, a cathode is heated by a filament and the cathode emits electrons in thermionic emissions. An arc current is applied and arcing occurs between the cathode and the walls of the chamber, ionizing the source gas molecules, creating ions. The ions are drawn out from the ionization chamber through an arc slit or opening using magnetic and electric fields, and are then directed through beam analyzers and focusing elements, and finally are accelerated and impacted onto the target device. As the use of carbon ion implantation increases, problems with oxidation and coating in the ion source head, and failures of the cathode in the ion source head, have been observed.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not drawn to scale.

DETAILED DESCRIPTION

The making and using of example illustrative embodiments are discussed in detail below. It should be appreciated, however, that the embodiments provide many applicable inventive concepts that can be embodied in a wide variety of specific contexts. The specific embodiments discussed are merely illustrative of specific ways to make and use the various embodiments, and do not limit the scope of the specification, or the appended claims.

Figure 1:
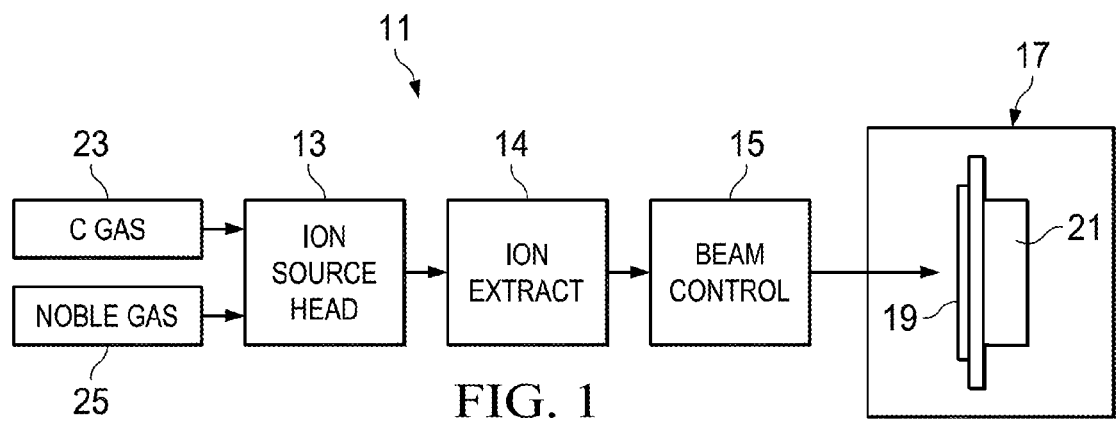
FIG. 1 illustrates in a simplified block diagram a first illustrative embodiment of an ion implantation devices.

FIG. 1 illustrates, in a simplified block diagram view, an ion implantation device 11 for implantation of carbon ions in accordance with various embodiments of the present disclosure. An ion source head 13 is provided and receives gasses from a carbon gas source 23 and a noble gas source 25. The ion source head ionizes gasses including carbon and emits carbon ions. The carbon gasses from carbon gas source 23 may be carbon dioxide, carbon monoxide, or similar carbon containing source gasses or combinations of these gasses. The noble gas source provides, in some embodiments, Xenon (Xe) gas. In some additional embodiments, a mixture comprising Xe gas is used. The size of the Xenon molecules is advantageous. However, other noble gasses could be used in alternative embodiments, such as Argon. In some embodiments, the ratio of the carbon containing gas to the noble gas is between about 5:1 to about 4:1. The ion extract block 14 receives carbon ions, and other species ions, from the ion source 13 and using the mass/charge ratio properties of the ions, and typically a curved path flight path formed using electric and magnetic fields, separates the unwanted ions from the carbon ions and steers the carbon ions to the beam control block 15. In the beam control block 15, the carbon ions are steered and accelerated to the desired energy level for ion implantation. Implantation energies of from 10 Kev-60 Kev may be obtained from the ion extract block 14, and then additional acceleration may be provided to accelerate ions up to 200 keV before impacting the target, typically a semiconductor wafer 19, that is mounted on a wafer holder 21 in the target chamber 17. A vacuum is maintained throughout the ion implantation device.

Figure 2:
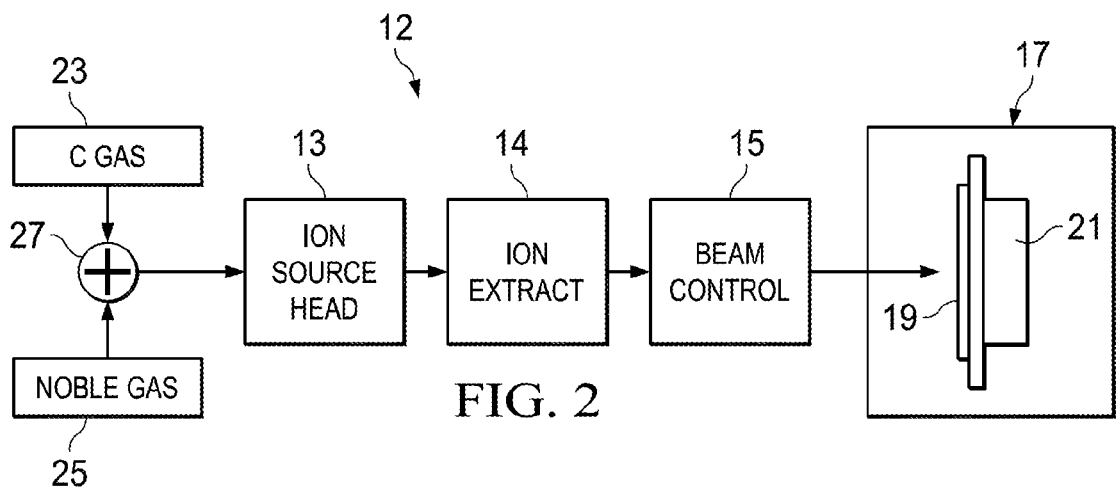
FIG. 2 illustrates in another simplified block diagram a second illustrative embodiment of an ion implantation device.

FIG. 2 depicts, in another simplified block diagram, an additional ion implantation device 12 in accordance with various embodiments of the present disclosure. In FIG. 2, the ion implantation device 12 includes a pre-mixer 27 that mixes the carbon containing gas and the noble gas from the carbon gas source 23 and the noble gas source 25, and the ion source head 13 receives the gasses in a pre-mixed form, together. The remaining blocks 14, 15 and 17 are the same as described above, and in operation, the ion source head 13 ionizes the gasses and outputs carbon ions into the ion extraction block 14 and the beam control block 15; and the carbon ions are selected and isolated by the use of the mass/charge ratios in magnetic fields. The carbon ions are accelerated and directed by the beam control block 15 onto the semiconductor wafer 19 in the target region 17. Carbon ions are thus implanted into the semiconductor substrate 19.

Figure 3:
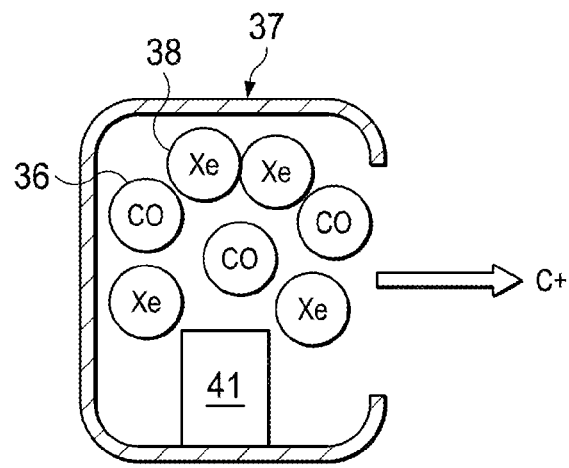
FIG. 3 illustrates the operation of an embodiment ion source head.

FIG. 3 depicts in a simplified block diagram the operation of an arc chamber 37 in accordance with various embodiments of the present disclosure. In FIG. 3, Xenon gas and a carbon containing gas such as CO are provided in the arc chamber, and a cathode 41 is used to ionize the gasses. The ionization process creates C+ ions, which are emitted from the arc chamber as shown. It can be seen that when the CO molecules, for example, are cracked to form carbon ions in ionization, then oxygen molecules ($O_2$) are present in the arc chamber 37 during the ionization. These oxygen molecules could oxidize the chamber surfaces and the cathode, coating the arc chamber, and resulting in a short source head lifetime.

The lifetime of the source head is the time between required maintenance cycles where the cathode must be replaced or reconditioned, and the chamber surfaces must be cleaned for proper operation. Oxidation of the surfaces and the cathode 41 can cause a short source head lifetime. However, it has been unexpectedly and surprisingly discovered that when Xenon gas is used as the carrier gas, and in combination, a graphite coating is applied to the surface of cathode 41, the source head life time is unexpectedly extended by many times that of the prior approaches. It is believed that the Xenon molecules inhibit oxidation of the arc chamber and cathode surfaces during ionization, and in addition, the electron bombardment of the graphite coating provides additional carbon molecules which are available for ionization. In experiments, the use of the embodiments with Xenon carrier gas and the graphite coating on the cathode surface extended the source head lifetime of an example ion source head for carbon ion implantation to 500 hours, as compared to about 150 hours for prior approaches, which is about a 3× increase in source head lifetimes that is obtained due to the use of the embodiments.

Figure 4:
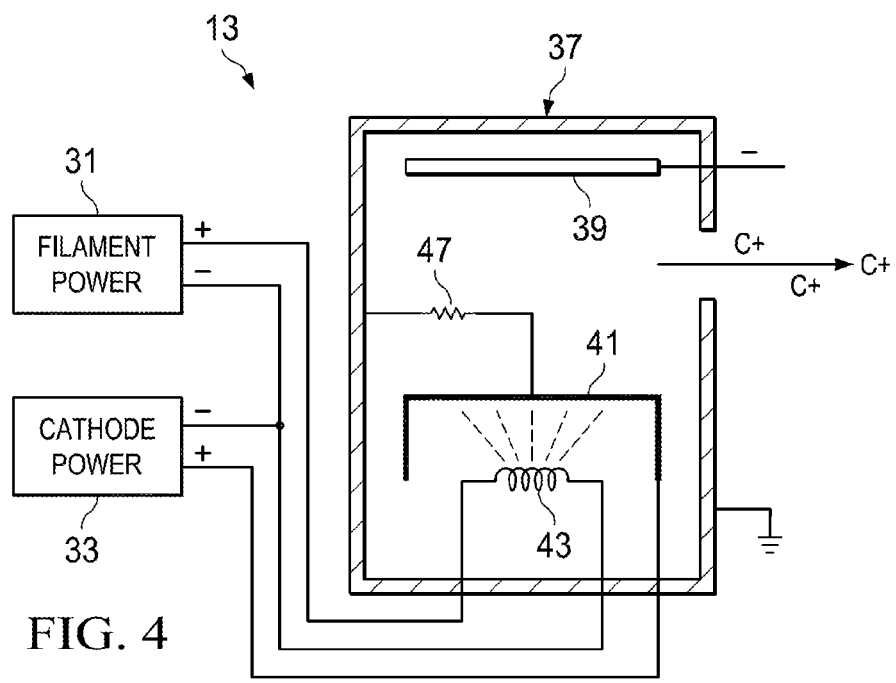
FIG. 4 illustrates in a block diagram an arc chamber for use with the embodiments.

FIG. 4 illustrates, in a cross sectional view, an example ion source head 13 in accordance with various embodiments of the present disclosure. Arc chamber 37 includes a repeller plate 39, a filament 43 and a cathode 41. In various embodiments of the present disclosure, the cathode may be formed of tungsten. In additional embodiments, the cathode may be formed of molybdenum. Alloys of these metals may also be used to form cathodes and these form additional embodiments. Carbon ions are emitted through a slit following ionization of the carbon gas. A cathode power supply provides a voltage of a potential as high as 600 Volts DC, or more typically between 300 to 400 Volts DC to the cathode. Filament 43, which is a conductive wire formed of tungsten, for example, is coupled to a second power supply 31. When the filament 43 receives power, it heats the cathode 41 as shown, and thermionic emission of electrons occurs from cathode 41. An arc current 47 is shown flowing between the cathode 41 and arc chamber 37, which is at a ground potential. The repeller plate 39 is placed at a negative voltage potential and repels the electrons to keep them moving in the chamber to ionize the process gas molecules. Electron bombardment also frees carbon from the graphite on the cathode, as described below.

Note that the gas sources 23 and 25 are also coupled to the ion source head 13 as shown in FIGS. 1 and 2 above, but for clarity these are omitted from FIG. 3. The carbon ions, shown as C+ in FIG. 4, are drawn out of the ion source head 13 by the use of electric fields and magnetic fields and directed into the remaining portions of the ion implantation device, as shown in FIGS. 1 and 2 above.

Figure 5:
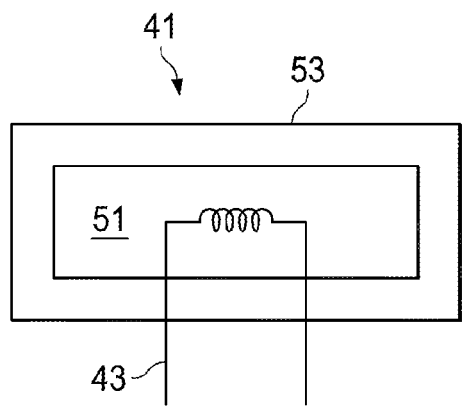
FIG. 5 illustrates in a in a cross-sectional view a cathode for an ion source of the embodiments.

FIG. 5 depicts in a simplified cross sectional view the cathode 41 in accordance with various embodiments of the present disclosure. Cathode 41 is formed of a first portion 51 which is formed of materials such as tungsten, molybdenum, aluminum and the like. A graphite coating 53 is formed coating at least portions of the exterior surface of the cathode 41. In various embodiments of the present disclosure, the graphite coating may be between 1-2 mm thick; in one non-limiting example embodiment the graphite coating was 1.5 mm thick, although other thicknesses may be used to form alternative embodiments. In various additional embodiments of the present disclosure, cathode 41 could be formed entirely from graphite and in such a case, an additional graphite coating such as 53 would not be necessary. Filament 43, which may be formed of conductive wire such as tungsten, aluminum, copper and the like is positioned to heat the cathode 51 and cause thermionic emission in the ionization operations, as described above. The graphite coating 53 protects and extends the life of the cathode 41, and by providing an additional source of carbon in the arc chamber during operation, adds to the carbon available for ionization. When used with the Xenon carrier gas as described above, the use of the embodiments surprisingly extends the lifetime of the source head to around 20 days, while for the prior approaches the source head lifetime was limited to 3-5 days, thus lowering costs and increasing efficiency.

Figure 6:
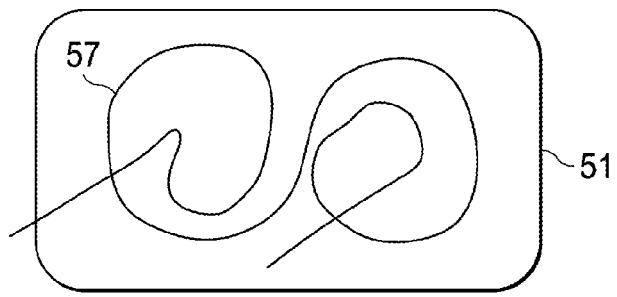
FIG. 6 depicts in a plan view a filament for use with the ion source embodiments

FIG. 6 depicts a filament 47 for use in the cathodes in accordance with various embodiments of the present disclosure. In some embodiments, the filament 57 has at least two complete loops of wire, as shown in FIG. 6. This is referred to as a "wandering" filament shape. Additional loops could be formed. The use of the at least two complete loops adds additional filament surface area at the interface between the filament wire 57 and the cathode material, increasing the surface area and the corresponding thermionic electron emissions from the cathode. The filament 57 is longer than the filaments used in the prior approaches, and the shape of the filament provides additional surface area.

Figure 7:
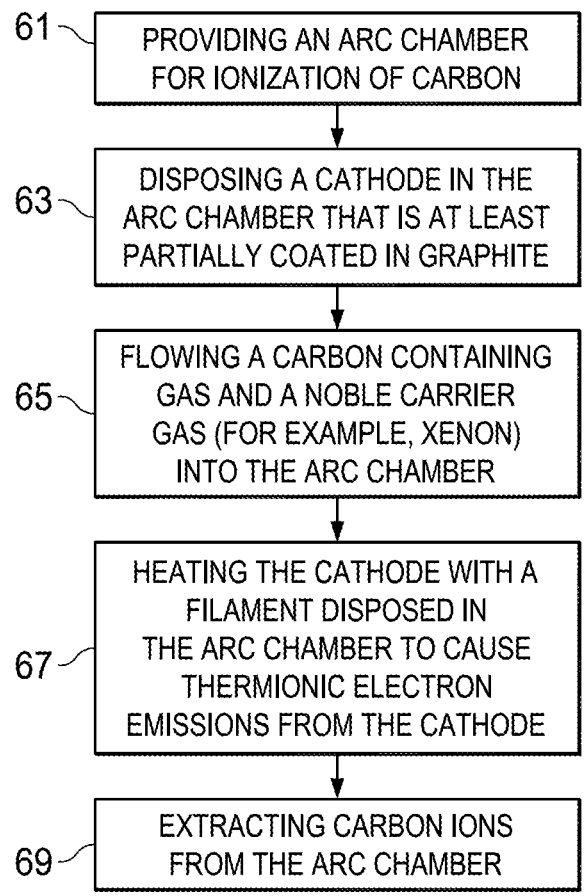
FIG. 7 depicts in a flow chart a method embodiment.

FIG. 7 illustrates a method in a flow diagram in accordance with various embodiments of the present disclosure. At step 61, an arc chamber is provided for the ionization of carbon. At step 63, a cathode is disposed in the arc chamber that is at least partially coated in graphite. At step 65, a carbon containing gas is flowed into the arc chamber with a noble carrier gas. In some embodiments, the carbon containing gas is carbon monoxide (CO). In other embodiments, the carbon containing gas may be carbon dioxide ($CO_2$). In additional embodiments, combinations of CO and $CO_2$ are used. In some embodiments, the noble gas is Xenon gas. In various other embodiments, a mixture including Xenon could be used. In other embodiments, other noble gasses may be used such as a mixture including Argon.

At step 67, the cathode is heated by a filament to cause thermionic emission of electrons, ionizing the carbon containing gas. In step 69, the carbon ions are extracted from the arc chamber as described above.

Use of the embodiments advantageously provides an apparatus and methods for providing an ion source for carbon ion implantation with a long source head lifetime. The combination of the graphite on the cathode with the use of the noble carrier gas gives unexpected results in that the source head lifetime is greatly extended when compared to prior approaches.

In an embodiment, an apparatus is disclosed including an ionization chamber configured to receive a process gas containing carbon and a noble carrier gas; a cathode disposed in the ionization chamber and configured to emit electrons in thermionic emission; a graphite exterior on at least a portion of the cathode; and an outlet on the ionization chamber configured to output carbon ions. In a further embodiment, in the above described apparatus, the apparatus includes a combined gas source vessel coupled to the ionization chamber, the combined gas source containing a mixture of the process gas containing carbon and the noble carrier gas. In yet a further alternative, the apparatus includes a noble carrier gas vessel coupled to the ionization chamber and a process gas vessel containing the carbon process gas coupled to the ionization chamber. In still another alternative embodiment, the above described apparatus includes a carbon containing gas that is one selected from the group consisting essentially of carbon monoxide and carbon dioxide and combinations thereof. In a further embodiment, the above described apparatus includes the noble carrier gas that comprises xenon gas. In another embodiment, the noble carrier gas is a mixture that includes xenon. In a further embodiment, the noble carrier gas comprises one selected from the group consisting essentially of xenon and argon. In still a further embodiment, the above described apparatus includes a filament configured to heat the cathode. In yet another embodiment, the apparatus further includes wherein the filament comprises a continuous conductor formed in at least two loops proximate to the cathode. In another embodiment, the cathode comprises a graphite exterior. In a further embodiment, the cathode is entirely of graphite. In still another embodiment, the cathode further comprises the graphite coating over a material that is one selected from the group consisting essentially of tungsten, molybdenum, alumina, and copper.

In a further embodiment, a method includes providing an ion source head configured to emit carbon ions for ion implantation; flowing a carbon containing process gas into the ion source head; flowing a noble gas into the ion source head; heating a cathode comprising a graphite exterior to cause thermionic electron emission; and extracting carbon ions from ionized gas that forms within the ion source head. In a further embodiment, in the above method, the cathode comprises a base material coated with graphite. In another embodiment, in the above method, the cathode comprises graphite. In another embodiment, in the above method, the cathode comprises a base material that is one selected from the group consisting essentially of tungsten and molybdenum and alloys thereof. In still another embodiment, in the above method, flowing a carbon containing process gas further comprises flowing a gas that is one selected from the group consisting essentially of carbon dioxide and carbon monoxide and combinations thereof. In yet another embodiment, in the above method, flowing a noble gas further comprises flowing a xenon gas. In a further embodiment, flowing a noble gas further comprises flowing a gas that includes xenon in a gas mixture. In still another embodiment, in the above method, heating the cathode comprises providing a filament wire that is proximate to a surface of the cathode, wherein the filament wire is a continuous wire that forms at least two complete 360 degree loops proximate to the cathode. In another embodiment, the filament wire comprises tungsten.

In yet another embodiment, a method includes providing an ion source head for emitting carbon ions; providing an ion extraction chamber coupled to the ion source head for extracting carbon ions; providing a beam control device coupled to the ion extraction chamber for selecting carbon ions and accelerating the carbon ions to a desired impact energy; providing a target chamber coupled to the beam control device for holding a semiconductor wafer to be implanted with the carbon ions; flowing a carbon containing process gas into the ion source head; flowing a noble carrier gas into the ion source head; and heating a cathode comprising graphite in the ion source head, the cathode emitting electrons into the carbon containing process gas due to thermionic emission.

In a further embodiment, the above method includes whereby the carbon containing process gas becomes ionized and carbon ions are emitted from the ion source head. In yet another embodiment, the above method includes wherein the carbon containing process gas comprises one selected from the group consisting essentially of carbon monoxide, carbon dioxide, and combinations thereof. In still another embodiment, the above method includes the noble carrier gas which comprises xenon gas. In a further embodiment, in the above methods, the cathode comprising graphite further comprises a cathode formed of a base material with a graphite coating on at least a portion of the base material. In still another embodiment, in the above methods, the cathode is entirely of graphite.

Although the example embodiments have been described in detail, it should be understood that various changes, substitutions and alterations can be made herein without departing from the spirit and scope of the application as defined by the appended claims. For example, different materials may be utilized for the conductors, the guard rings, the solder balls, the build up layers, or different methods of formation may be utilized for the various layers of material. These devices, steps and materials may be varied while remaining within the scope of the appended claims.

Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding embodiments described herein may be utilized according to the embodiments and alternative embodiments. Accordingly, the appended claims are intended to include within their scope such processes, machines, manufacture, compositions of matter, means, methods or steps.

What is claimed is:

1. An apparatus, comprising:
    an ionization chamber configured to receive a process gas containing carbon and a noble carrier gas;
    a cathode disposed in the ionization chamber and configured to emit electrons in thermionic emission;
    graphite on at least a portion of the exterior of the cathode; and
    an outlet on the ionization chamber configured to output carbon ions.

2. The apparatus of claim 1 and further comprising a combined gas source vessel coupled to the ionization chamber, the combined gas source containing a mixture of the process gas containing carbon and the noble carrier gas.

3. The apparatus of claim 1 and further comprising a noble carrier gas vessel coupled to the ionization chamber and a process gas vessel containing the carbon process gas coupled to the ionization chamber.

4. The apparatus of claim 1 wherein the process gas containing gas is one selected from the group consisting essentially of carbon monoxide and carbon dioxide and combinations thereof.

5. The apparatus of claim 1 wherein the noble carrier gas comprises one selected from the group consisting essentially of xenon gas and a gaseous mixture including xenon.

6. The apparatus of claim 1 and further comprising a filament configured to heat the cathode.

7. The apparatus of claim 6 wherein the filament comprises a continuous conductor formed in at least two loops proximate to the cathode.

8. The apparatus of claim 1 wherein the cathode further comprises a graphite coating over a material that is one selected from the group consisting essentially of tungsten, molybdenum, alumina, and copper.

9. The apparatus of claim 1 wherein the cathode is of graphite.

10. A method comprising:
    providing an ion source head configured to emit carbon ions for ion implantation;
    flowing a carbon containing process gas into the ion source head;
    flowing a noble gas into the ion source head;
    heating a cathode comprising a graphite exterior to cause thermionic electron emission; and
    extracting carbon ions from ionized gas that forms within the ion source head.

11. The method of claim 10, wherein the cathode comprises a base material coated with graphite.

12. The method of claim 10, wherein the cathode comprises a base material that is one selected from the group consisting essentially of tungsten and molybdenum and alloys thereof.

13. The method of claim 10, wherein the cathode is entirely of graphite.

14. The method of claim 10, wherein flowing a carbon containing process gas further comprise flowing a gas that is one selected from the group consisting essentially of carbon dioxide and carbon monoxide and combinations thereof.

15. The method of claim 10 wherein flowing a noble gas further comprises flowing a xenon gas.

16. The method of claim 10, wherein heating the cathode comprises:
providing a filament wire that is proximate to a surface of the cathode, wherein the filament wire is a continuous wire that forms at least two complete 360 degree loops proximate to the cathode.

17. A method for ion implantation of carbon, comprising:
providing an ion source head for emitting carbon ions;
providing an ion extraction chamber coupled to the ion source head for extracting carbon ions;
providing a beam control device coupled to the ion extraction chamber for selecting carbon ions and accelerating the carbon ions to a desired impact energy;
providing a target chamber coupled to the beam control device for holding a semiconductor wafer to be implanted with the carbon ions;
flowing a carbon containing process gas into the ion source head;
flowing a noble carrier gas into the ion source head; and
heating a cathode comprising graphite in the ion source head, the cathode emitting electrons into the carbon containing process gas due to thermionic emission;
whereby the carbon containing process gas becomes ionized and carbon ions are emitted from the ion source head.

18. The method of claim 17, wherein the carbon containing process gas comprises one selected from the group consisting essentially of carbon monoxide, carbon dioxide, and combinations thereof.

19. The method of claim 17, wherein the noble carrier gas comprises xenon gas.

20. The method of claim 17, wherein the cathode comprising graphite further comprises a cathode formed of a base material with a graphite coating on at least a portion of the base material.

* * * * *